(12) United States Patent
Cheng et al.

(10) Patent No.: US 7,264,982 B2
(45) Date of Patent: Sep. 4, 2007

(54) TRENCH PHOTODETECTOR

(75) Inventors: Kangguo Cheng, Beacon, NY (US); Ramachandra Divakaruni, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 10/904,255

(22) Filed: Nov. 1, 2004

(65) Prior Publication Data

US 2006/0091489 A1 May 4, 2006

(51) Int. Cl.
*H01L 21/027* (2006.01)
(52) U.S. Cl. .............................. 438/48; 438/65; 438/66
(58) Field of Classification Search .................. 438/48, 438/65, 66
See application file for complete search history.

(56) References Cited

U.S. PATENT DOCUMENTS

| | | | |
|---|---|---|---|
| 4,447,746 A | 5/1984 | Fang et al. |
| 5,084,409 A | 1/1992 | Beam, III et al. |
| 5,130,528 A | 7/1992 | Phillips, Jr. |
| 5,279,974 A | 1/1994 | Walsh |
| 5,381,231 A | 1/1995 | Tu |
| 5,721,429 A | 2/1998 | Radford et al. |
| 5,783,844 A | 7/1998 | Kobayashi et al. |
| 5,886,374 A | 3/1999 | Sakamoto et al. |
| 6,133,615 A | 10/2000 | Guckel et al. |
| 6,147,349 A | 11/2000 | Ray |
| 6,177,289 B1 | 1/2001 | Crow et al. |
| 6,195,485 B1 | 2/2001 | Coldren et al. |
| 6,197,575 B1 | 3/2001 | Griffith et al. |
| 6,222,951 B1 | 4/2001 | Huang |
| 6,351,575 B1 | 2/2002 | Gampp et al. |
| 6,403,986 B1 | 6/2002 | Kobayashi et al. |
| 6,451,702 B1 | 9/2002 | Yang et al. |
| 6,538,299 B1 | 3/2003 | Kwark et al. |

(Continued)

OTHER PUBLICATIONS

M. Yang "A High Speed High-Sensitivity Silicon Lateral Trench Photodetector", IEEE Electron Device Letters, vol. 23, p. 395-397, 2002.

(Continued)

*Primary Examiner*—Douglas W. Owens
(74) *Attorney, Agent, or Firm*—Steven Capella

(57) ABSTRACT

Trench type PIN photodetectors are formed by etching two sets of trenches simultaneously in a semiconductor substrate, the wide trenches having a width more than twice as great as the narrow trenches by a process margin; conformally filling both types of trenches with a sacrificial material doped with a first dopant and having a first thickness slightly greater than one half the width of the narrow trenches, so that the wide trenches have a remaining central aperture; stripping the sacrificial material from the wide trenches in an etch that removes a first thickness, thereby emptying the wide trenches; a) filling the wide trenches with a second sacrificial material of opposite polarity; or b) doping the wide trenches from the ambient such as by gas phase doping, plasma doping, ion implantation, liquid phase doping, infusion doping and plasma immersion ion implantation; diffusing the dopants into the substrate, forming p and n regions of the PIN diode; removing the first and the second sacrificial materials, and filling both the wide and the narrow sets of trenches with the same conductive material in contact with the diffused p and n regions.

12 Claims, 16 Drawing Sheets

U.S. PATENT DOCUMENTS 6,574,022 B2  6/2003  Chow et al.
6,574,398 B2  6/2003  Coldren et al.
6,576,556 B2  6/2003  Kimata et al.

OTHER PUBLICATIONS

M. Yang "High Speed Silicon Lateral Trench Photodetector on SOI Substrate," IEDM, p. 547-550, 2001.

TRENCH PHOTODETECTOR

TECHNICAL FIELD

The field of the invention is that of solid state device fabrication, in particular photodetectors made with integrated circuit techniques.

BACKGROUND OF THE INVENTION

Solid state photodetectors made with integrated circuit techniques, e.g. PIN, (p-i-n) diodes, are very popular. They are extensively applied to various optical devices such as optical sensors, optical receivers and photocouplers. Photodetectors are widely used in integrated photo-electronics, fiber optic communications, optical interconnection, etc.

For example, the backbone links on the Internet are fiber optic cables that require photodetectors at each receiving location to receive the signal transmitted.

Similarly, fiber optic cables requiring photodetectors are extensively used in telephone systems.

Given the constant pressure in integrated circuit fabrication to reduce costs, it is not surprising that various schemes have been attempted to produce photodetectors at lower cost.

FIG. 1 shows in cross section a typical trench photodetector. On the left, a trench has been etched in silicon substrate 10 to a depth indicated by bracket 90. P-type dopant has been diffused out of the trench into the substrate, forming p-type region 112. The trench has been filled with P+ polysilicon 115, forming a conductive path to ohmic contact 110, illustratively silicide, which is connected to ground.

On the right, a counterpart N-type doped area 132 has been formed and an N+ polysilicon area 135 fills the trench up to suicide 130, connected to a positive voltage. A cap layer 120 has protected the top of the substrate 10 during previous processing steps.

Lightly doped or intrinsic region 150 receives incident light and generates electron-hole pairs. The electrons so generated in response to incident light are attracted to the positive terminal. The flow of electrons may be detected by a number of well-known methods that are known in the art.

The trenches have been etched to a depth 90 that is preferably about the same as the penetration depth of the incident light. As is known, light will penetrate silicon to a depth that depends on the wavelength of the light, among other things. Illustratively, light of wavelength 845 nm will penetrate to a depth of about 15 to 20 microns, since silicon has a relatively low absorption coefficient.

Etching trenches is a slow and therefore expensive process. A trench depth greater than the penetration depth brings no additional benefit and is a waste of money. A trench depth shallower than the penetration depth will depend on a cost/benefit tradeoff. If the intensity of the incident light is great enough that an adequate signal may be obtained at a trench depth less than the penetration depth, then the shallow depth may be economically beneficial.

FIG. 2 illustrates a top view of a prior art photodetector. At the top of the Figure, a p-contact 20 has been formed connecting a number of P-type trenches 22-1 through 22-n in a standard layout in which the contributions from several trenches having the same dimension are added. At the bottom, a counterpart n-contact 30 connects the N-type trenches 32-1 through 32-n.

The n- and p-type trenches are preferably spaced in a tradeoff between greater efficiency in intercepting photons and response time of the device.

FIG. 3 shows in cross section a portion of the multi-element photodetector of FIG. 2, in which the n-type trench electrode 235 has a diffused area 232 formed in the intrinsic silicon substrate 10. Similarly, the P-type electrode 215 has a p-type diffused area 212.

This Figure also shows that the width of the two types of trench is the same, illustratively the minimum width permitted by the lithography (or by the technology of trench etching).

A drawback of this prior art arrangement is that it takes two mask levels to form (and fill) the p and n trenches.

A first method that has been used in the prior art is:
Form deep trenches with a first hardmask and first mask;
Remove the first hardmask;
Fill the trenches with a sacrificial oxide such as BSG;
Deposit a second hardmask;
Remove the BSG from every other trench by using a second mask;
Fill the empty (alternating) trenches with a first type of polysilicon;
Planarize the first polysilicon by a technique such as chemically mechanical polishing (CMP);
Remove the second hardmask;
Remove BSG from the other trenches;
Fill the empty trenches with a second type of polysilicon (opposite polarity);
Planarize the second polysilicon by a second CMP step; and
Form contacts to the two polysilicon electrodes.

This first method requires two masks, which are complex and costly. In addition, since this first method requires two masks, there is a mis-alignment issue. A hardmask must be deposited, patterned, and removed twice. The sacrificial oxide has to be removed from the deep trench twice. The n and p trenches have to be filled with two types of doped polysilicon in two separate steps. Polysilicon has to be planarized twice in two CMP steps.

A second method requires two deep trench steps:
Form the first type of deep trenches with a first hardmask and first mask;
Remove the first hardmask;
Fill the trenches with a first type of polysilicon;
Planarize the first polysilicon by a first CMP;
Form the second type of deep trenches with a second hardmask and second mask;
Remove the second hardmask;
Fill the trenches with a second type of polysilicon;
Planarize the second polysilicon by a second CMP; and
Form contacts to the two polysilicon electrodes.

This second prior art method has the drawback that it requires two deep trench steps. Forming deep trenches is very slow and thus is an expensive process requiring considerable process time and significant cost. In addition, this second method requires two masks, which raises the misalignment issue. It also requires two hardmask deposition, patterning, removing steps and two polysilicon CMP steps. The n and p trenches have to be filled with two types of doped polysilicon in two separate steps. Polysilicon has to be planarized twice in two CMP steps.

Moreover, polysilicon is used in prior art methods. Two deposition processes are required in order to fill the n-type trenches with n-type polysilicon and the p-type trenches with p-type polysilicon. Furthermore, as the trenches become narrower and narrower as technology advances, the resistance of polysilicon in deep and narrow trenches increases, slowing the response of the photodetector.

SUMMARY OF THE INVENTION

The invention relates to a method of making a photodetector with integrated circuit techniques in which one type of trench is considerably wider than the other, in order to permit differential removal of a sacrificial filler material without an extra mask step.

A feature of the invention is the simultaneous formation of both types of trenches, one of which has a wider width adapted to be only partially filled by a sacrificial material that completely fills the narrower trenches.

Another feature of the invention is the related widths of the trenches such that the wider trench has a width more than twice as great as the width of the narrower trench.

Another feature of the invention is that the thickness of the sacrificial material has a thickness greater than one half the width of the narrower trench and less than one half the width of the wider trench.

Yet another feature of the invention is a step of doping the open wide trenches from the ambient.

Yet another feature of the invention is a step of doping the wide trenches by one of: gas phase doping, plasma doping, ion implantation, liquid phase doping, infusion doping, or plasma immersion ion implantation.

Yet another feature of the invention is that both the wide and the narrow trenches are filled with the same conductive material.

Yet another feature of the invention is that the narrow trenches are filled with the same conductive material that has a lower resistance than polysilicon.

DETAILED DESCRIPTION

Figure 1:
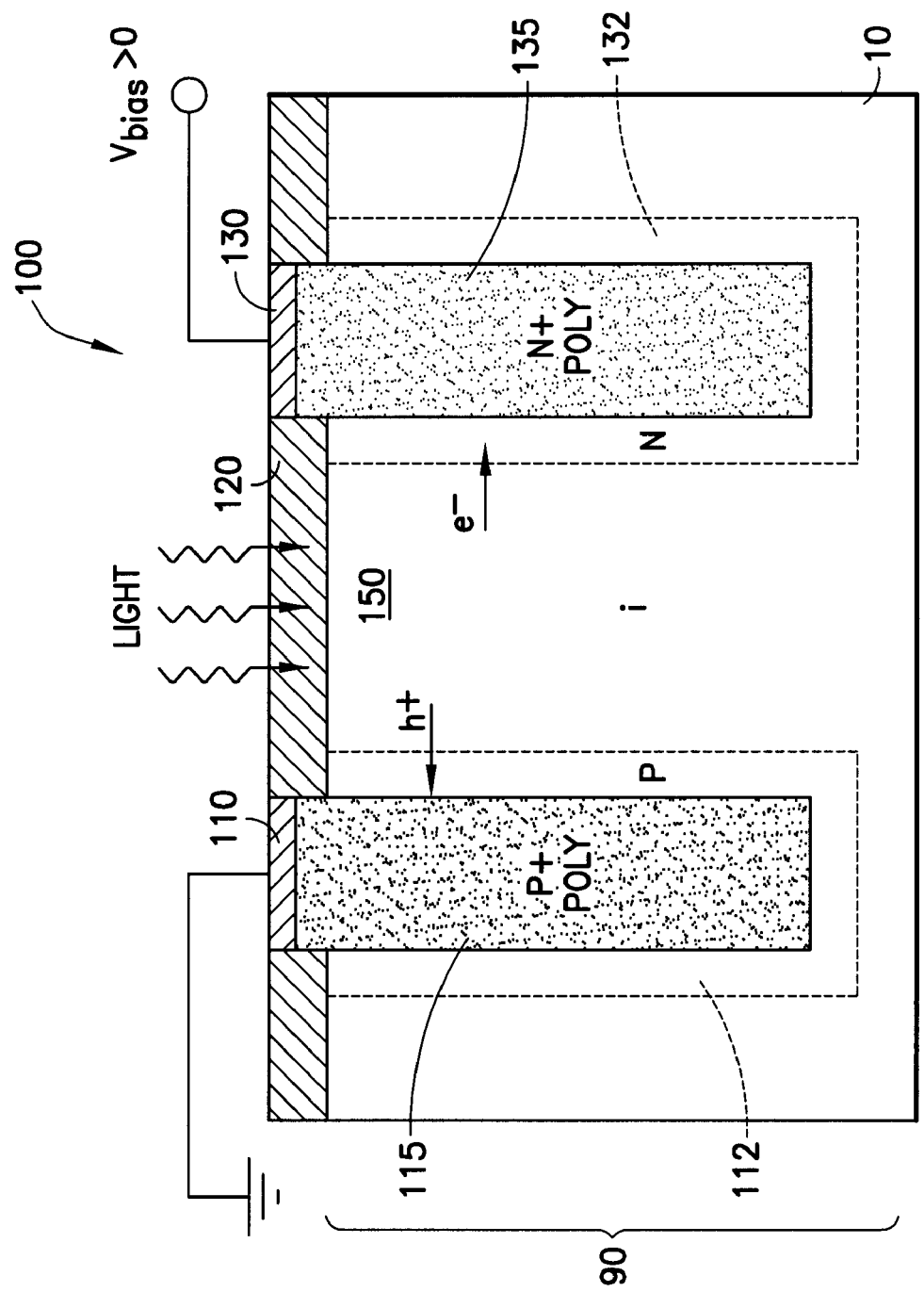
FIG. 1 shows a cross section of a completed photodetector according to the prior art.
Figure 2:
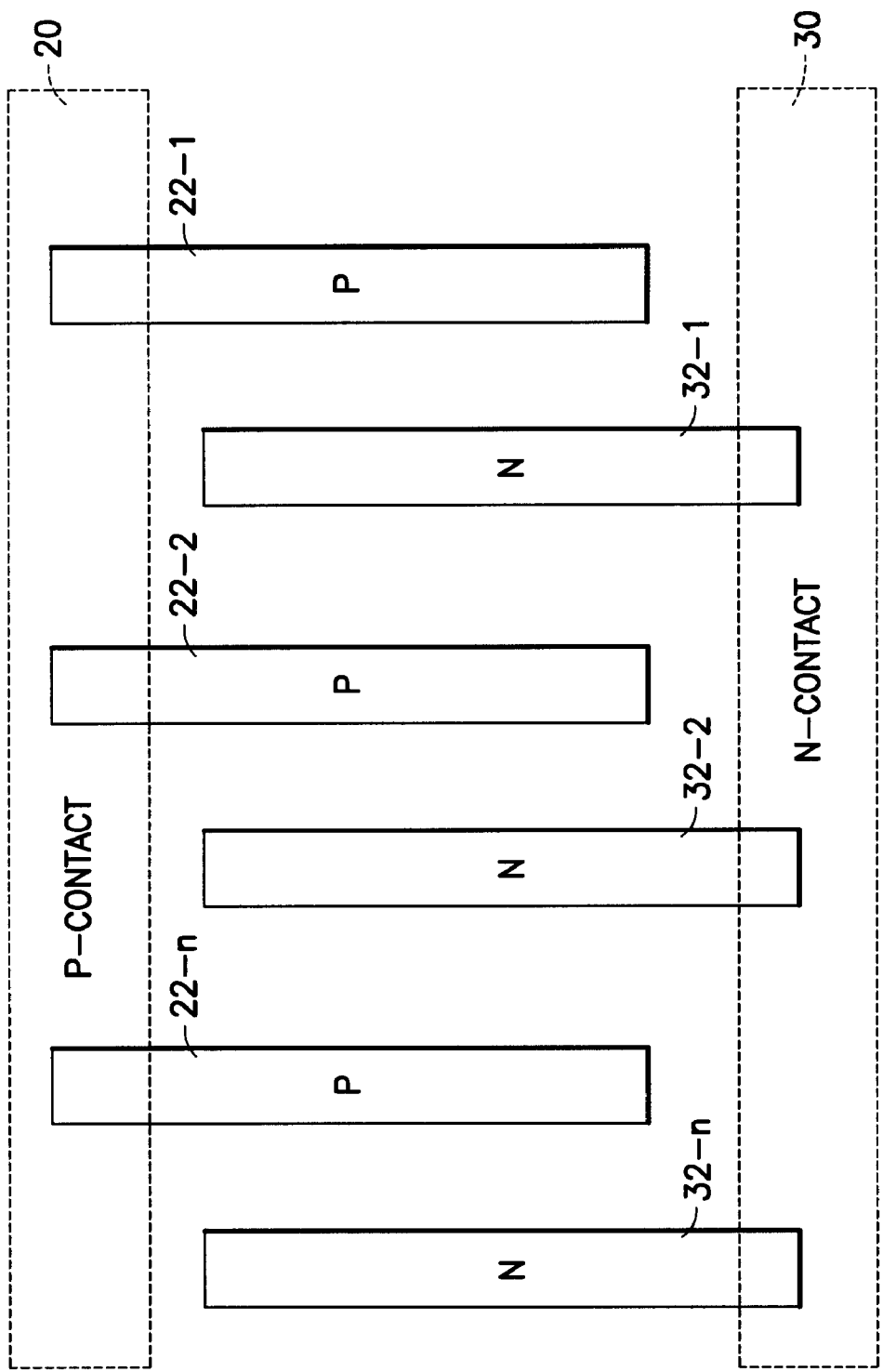
FIGS. 2 and 3 show steps in a prior art method.
Figure 3:
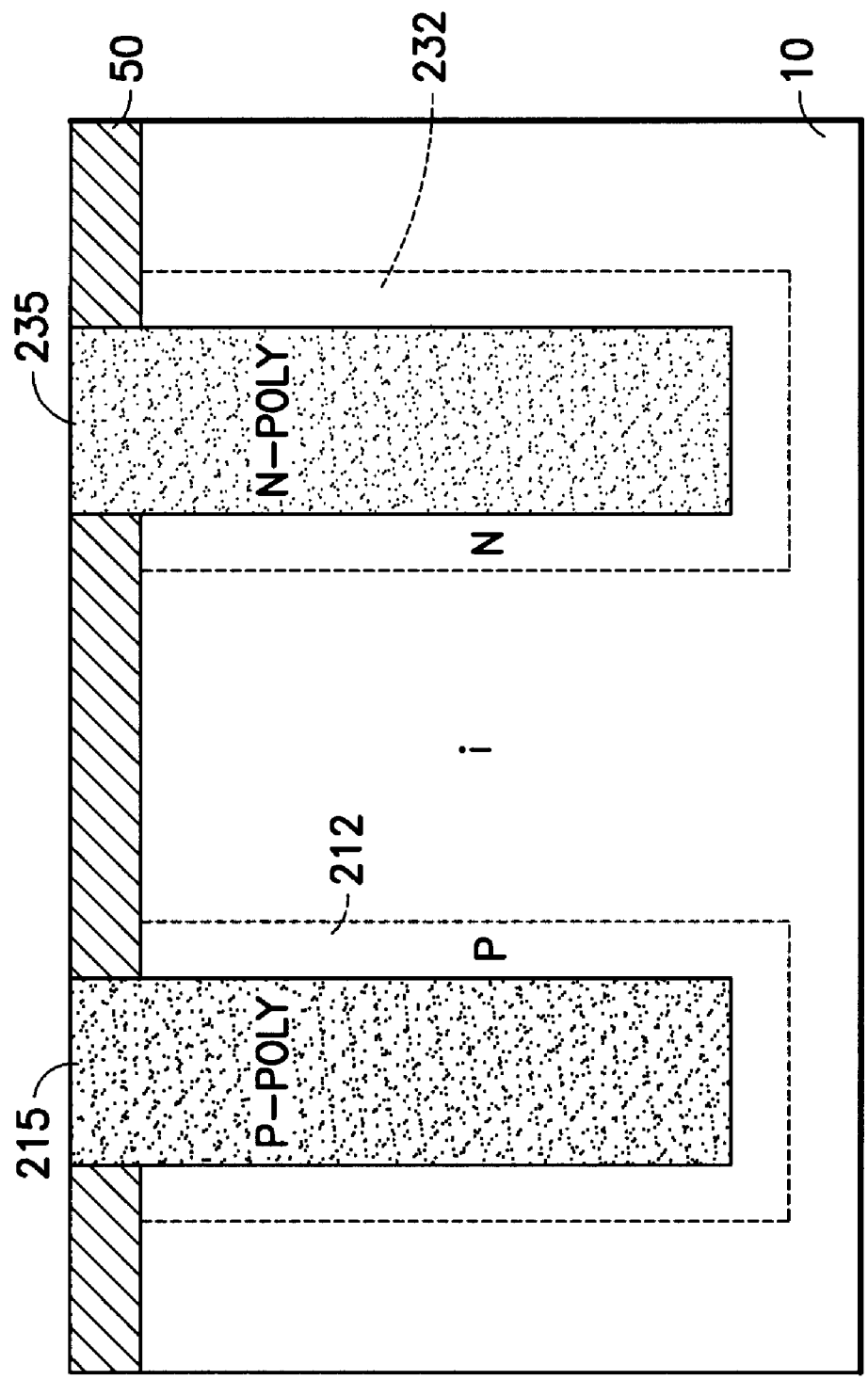
Figure 4:
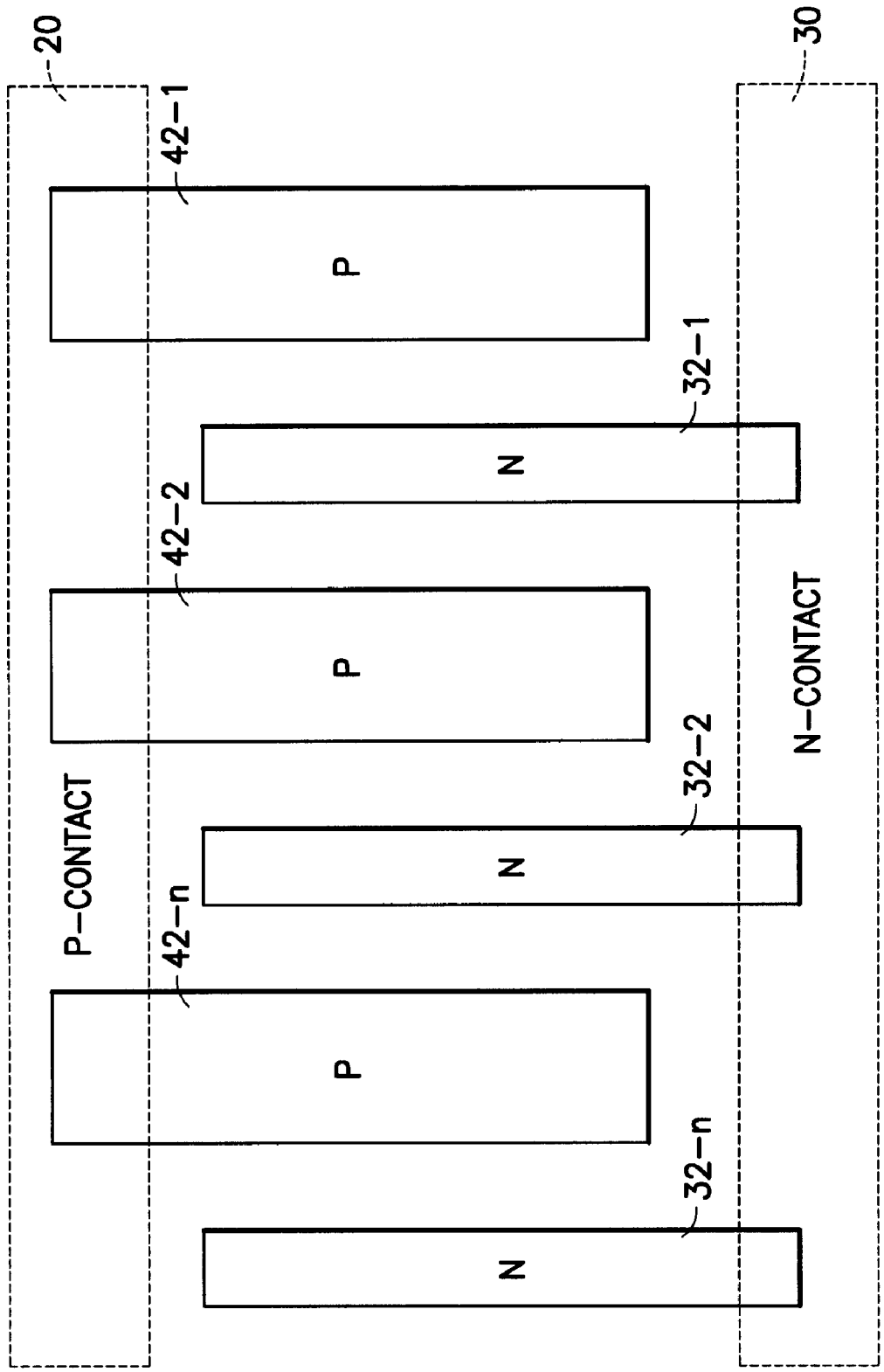
FIG. 4 shows a top view of a photodetector according to the invention.

FIG. 4 shows a top view of an intrinsic silicon substrate containing a photodetector according to the invention in which a P-contact 20 at the top of the Figure and an N-contact at the bottom of the Figure make contact to a set of offset fingers 42-1 to 42-n and 32-1 to 32-n, respectively.

The fingers are trenches formed in the substrate that have been filled with an appropriate conductive material.

The N and P contacts and the portion of the substrate between them will form a photodetector of the PIN diode type, in which incident light will form electron-hole pairs in a back-biased diode. The electrons released by this process will be swept into the positive terminal of the detector, creating a current that is a measure of the incident light.

Such photodetector diodes are well known in the art, as are circuits to sense and measure the current released by the incident photons.

Figure 5:
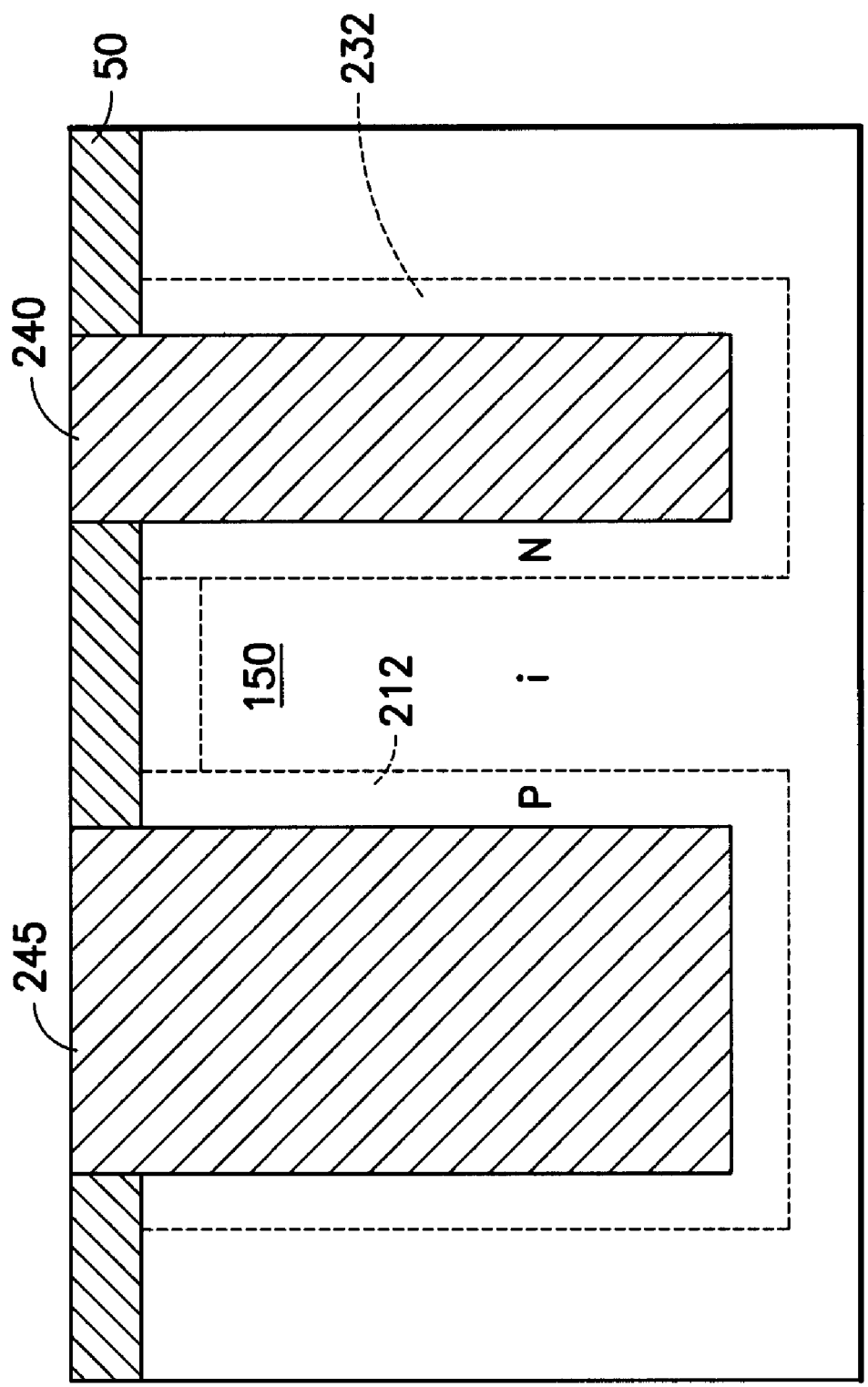
FIG. 5 shows a cross section of a photodetector according to the invention.

FIG. 5 shows the same region in cross section. Metal 240 fills the right-hand trench, surrounded by an N-type region 232 diffused out from a sacrificial material in an earlier step. Similarly, metal 245 fills the left-hand trench, surrounded by P-type region 212 diffused out from sacrificial material doped with the opposite polarity. Illustratively, the sacrificial material was oxide, doped appropriately to diffuse into the substrate 10 and establish the doped diode areas. Region 150 is the intrinsic or lightly doped area that generates the electron-hole pairs in response to incident light. Cap layer 50, illustratively nitride, protects the silicon surface of the intrinsic area 150 during CMP and other steps.

Figure 6:
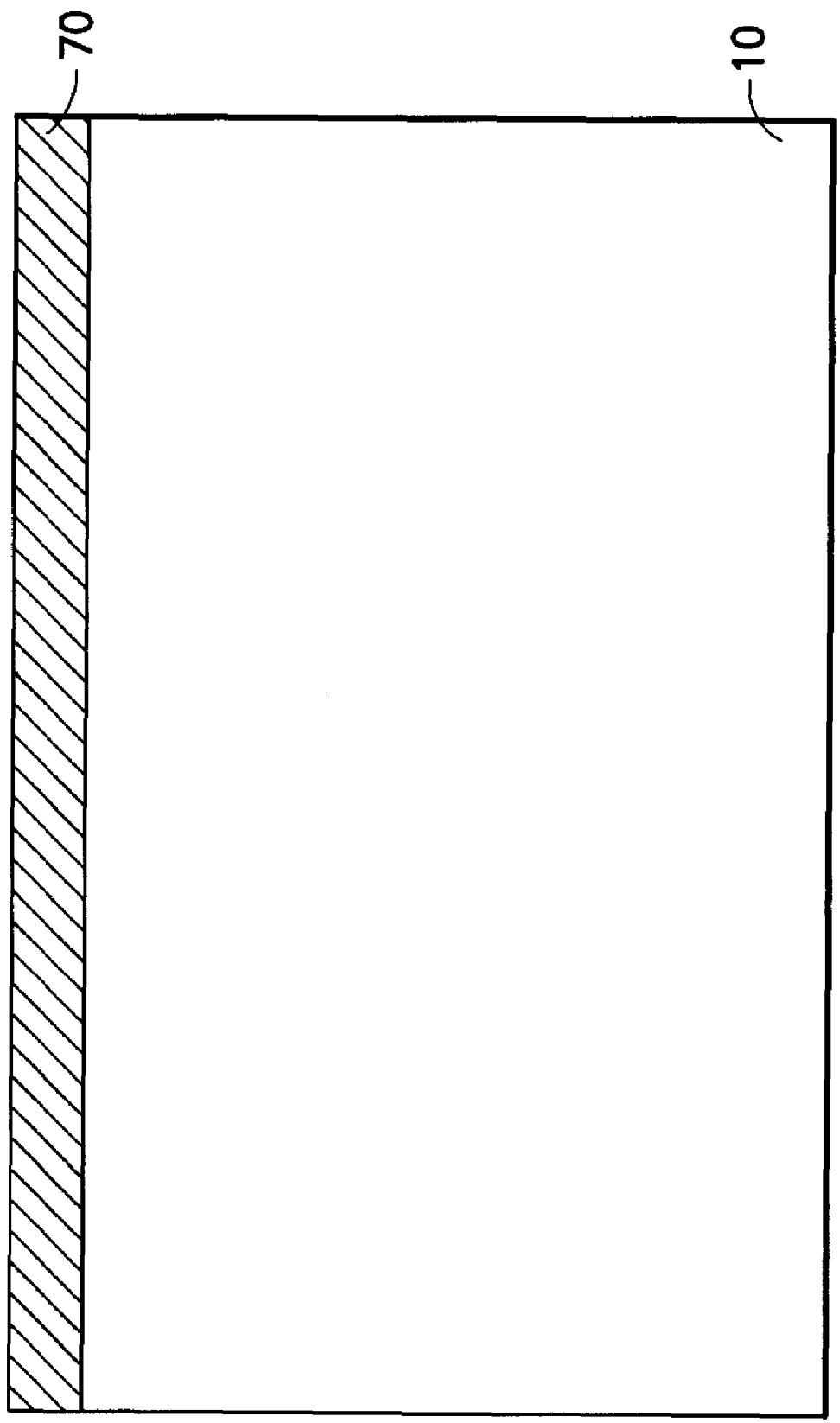
FIGS. 6-13 shows steps in a method of making the invention.

Referring now to FIG. 6, there is shown in cross section an initial stage is the formation process of the photodetector. Substrate 10 is intrinsic or lightly doped silicon. A conventional pad layer 70 is formed from pad nitride on top of pad oxide. This pad layer may perform its usual functions in other parts of the circuit that contain conventional CMOS circuits and/or it protects the area that will become the photodetector.

Figure 7:
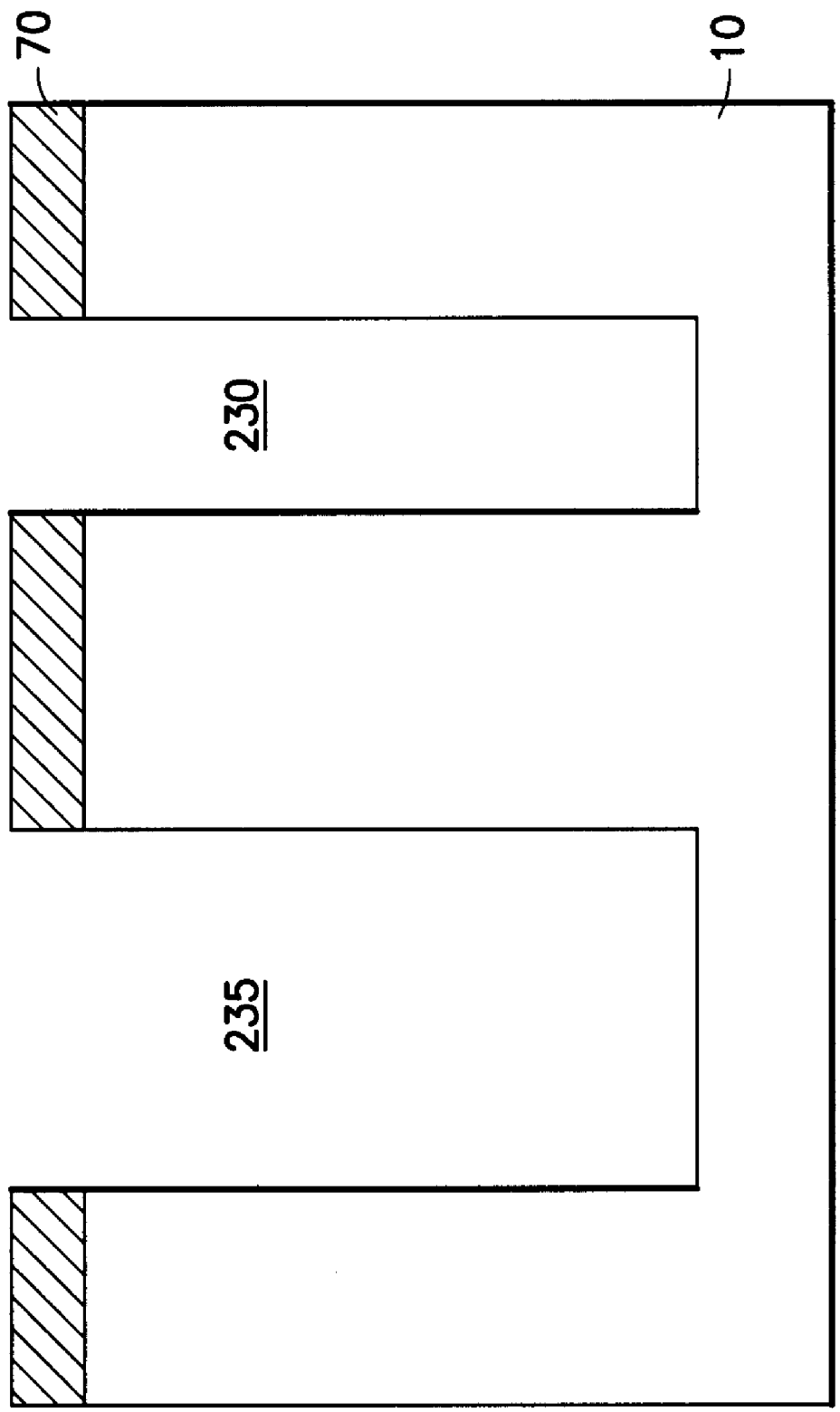

FIG. 7 shows the result of etching deep trenches. Only two trenches are shown for simplicity in the drawing. Actual operational diodes conventionally have additional fingers of N and P trenches. The trenches are formed by: a) depositing a hard mask (e.g. oxide); b) patterning the desired trench pattern in a resist layer not shown; c) opening the hardmask and pad layer by RIE; d) stripping the resist; e) etching the deep trenches by RIE; and f) stripping the remaining hardmask. The result is shown in FIG. 7, in which pad layer 70 remains and two trenches 230 and 235 have been etched to a depth set to be equal to the penetration depth of the photons to be detected; or, as a design choice, to a smaller depth. The trenches have different widths, as explained below.

Figure 8:
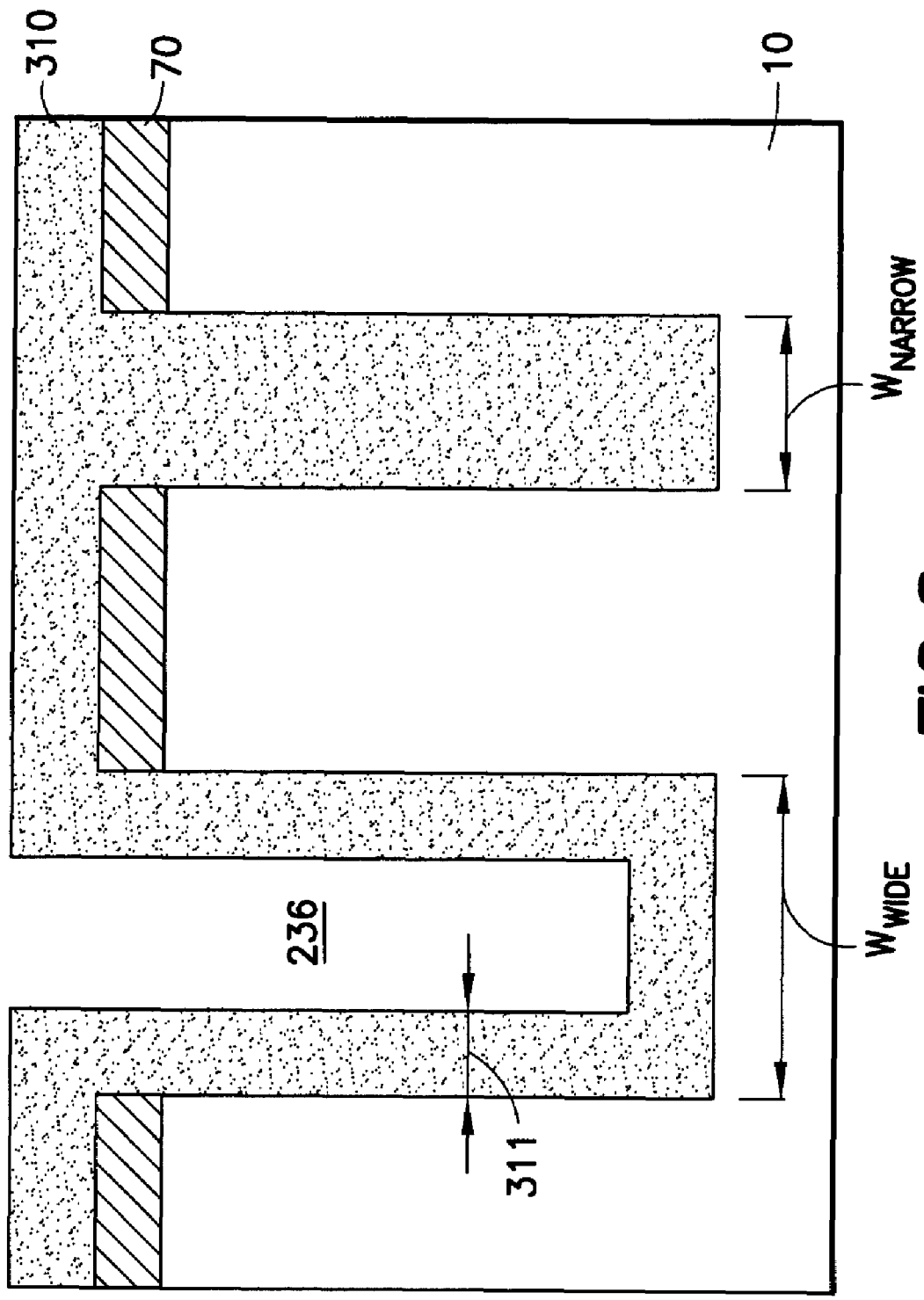

FIG. 8 shows the next step, in which a doped temporary material has been conformally deposited in both trenches. In this example, the temporary material is arsenic-doped silicate glass 310 (ASG) for n-type doping. The thickness 311 of oxide 310 has been selected to be greater than one half the width of the narrow trench, such that a conformal deposition method fills the narrow trench entirely and extends above pad layer 70 by a thickness that protects the contents of trench 230. On the left of the Figure, there is a remaining central aperture 236 in trench 235. The width of trench 235 should be greater than twice the width of trench 230, plus a margin that allows for the central aperture to be present in spite of inevitable process fluctuations.

This step will be referred to as conformally partially filling the wide trench, in order to distinguish this process of filling the full height of the wide trench, but not its entire volume from a step of filling the entire width of the trench to less than the full height.

Figure 9:
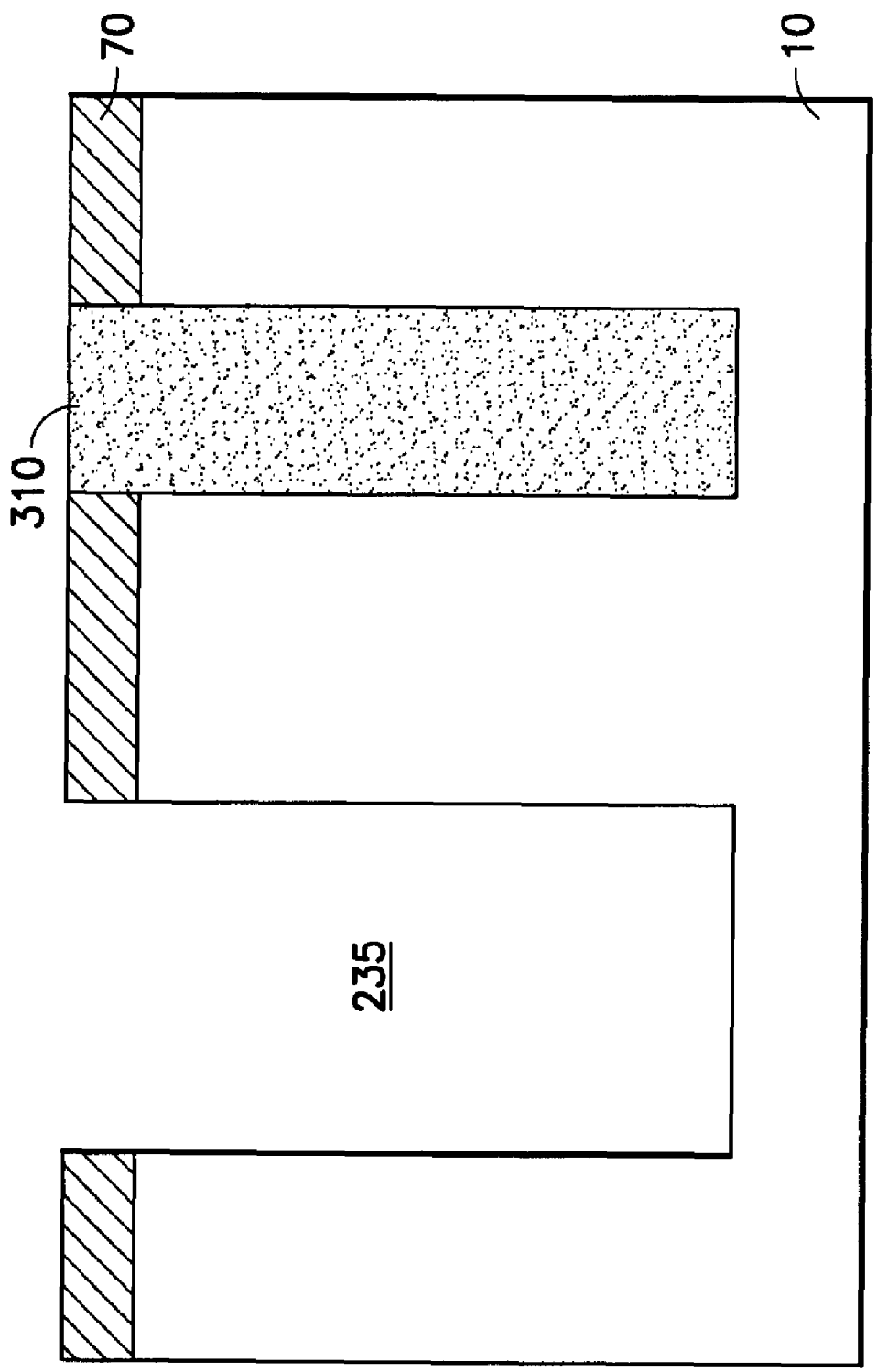

Filler 310 is removed from the wide trench 235 by an isotropic etch that attacks the ASG 310 all along the depth of aperture 236, as well as the material on the top of the pad layer 70. The result, shown in FIG. 9, is that the ASG is removed from the pad layer and from the interior of trench 235. The etch parameters will be selected to remove the material on the top of the pad layer 70, plus a process margin to allow for a conventional overetch. The material in trench 230 is unaffected because the etch stopped after the material on the top of pad 70 was removed. Exemplarily, a conventional wet etch with the etchant of buffered hydrofluoric acid (BHF) can be used to etch the ASG.

Figure 10:
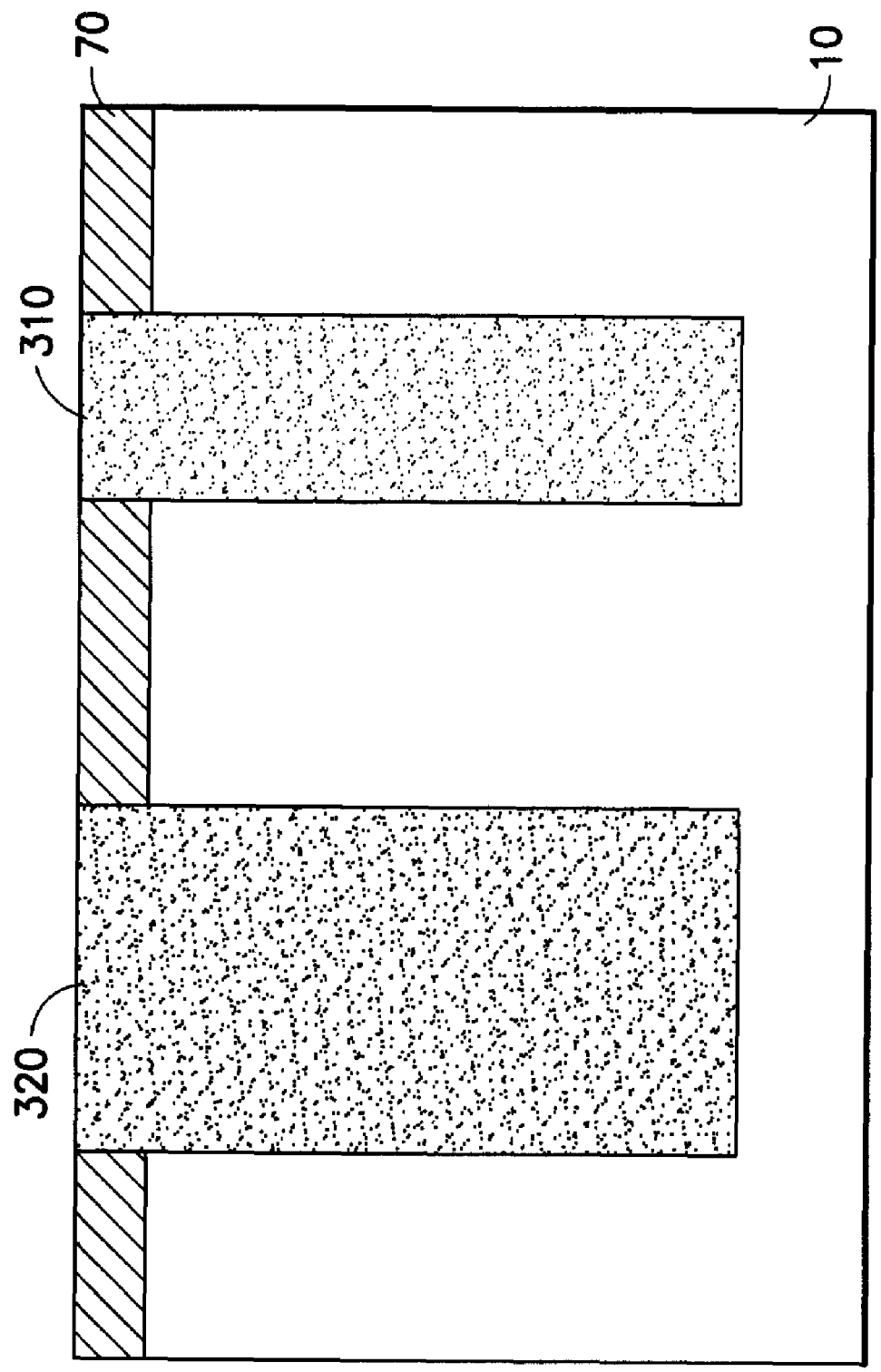

FIG. 10 shows the result of depositing a second sacrificial material in trench 235. This second material 320 may illustratively be boron-doped silicate glass (BSG) to provide a source for P-type dopant. FIG. 10 illustrates trench 235 as having been filled completely. This is an option and the trench could have only a liner of sufficient thickness to provide enough dopant. FIG. 10 also shows the result of an optional planarization step, removing material 320 from the horizontal surface of pad 70.

Figure 11:
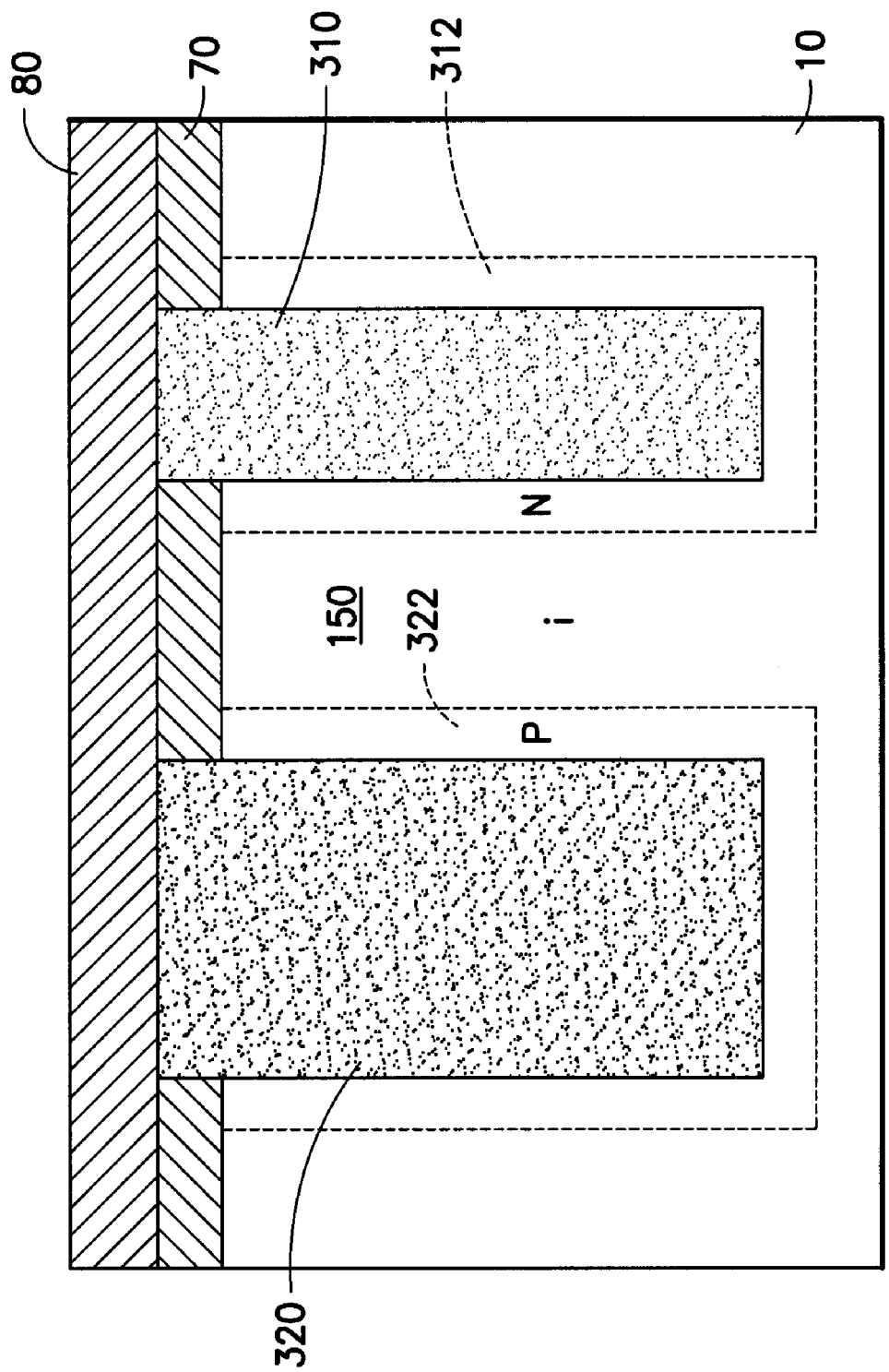

FIG. 11 shows the result of an optional step of depositing a cap layer 80 (e.g. oxide) that blocks the dopant in materials 310 and 320 from escaping into the ambient and depositing in an unwanted location elsewhere on the wafer being processed.

FIG. 11 also shows the result of an anneal that forms doped areas 312 (N-type) and 322 (P-type) that are the N and P areas of the PIN diode.

Figure 12:
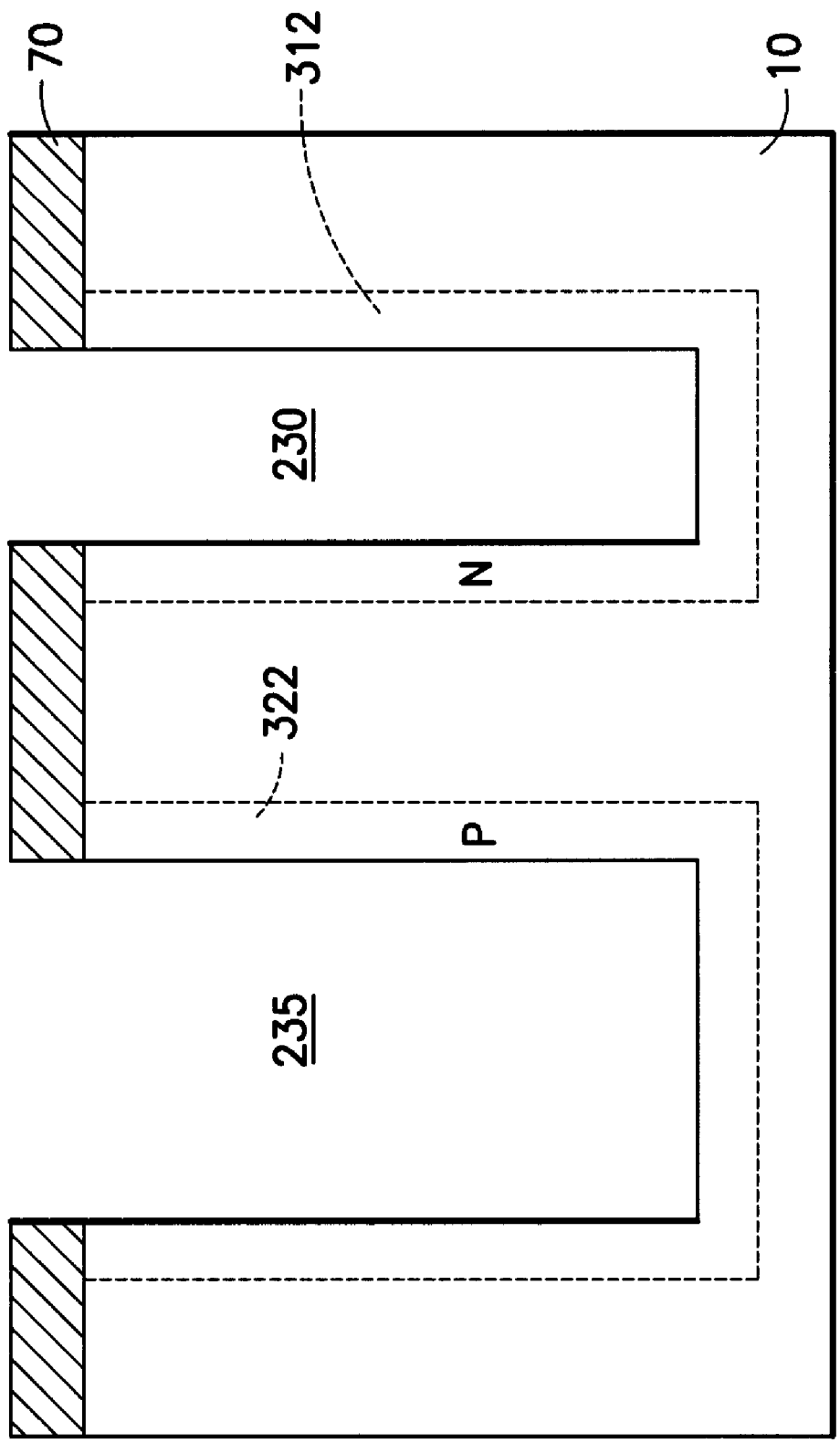

FIG. 12 shows the result of removing the cap layer 80 and the two oxide fills 310 (ASG) and 320 (BSG). A conventional wet BHF etch is adequate.

Figure 13:
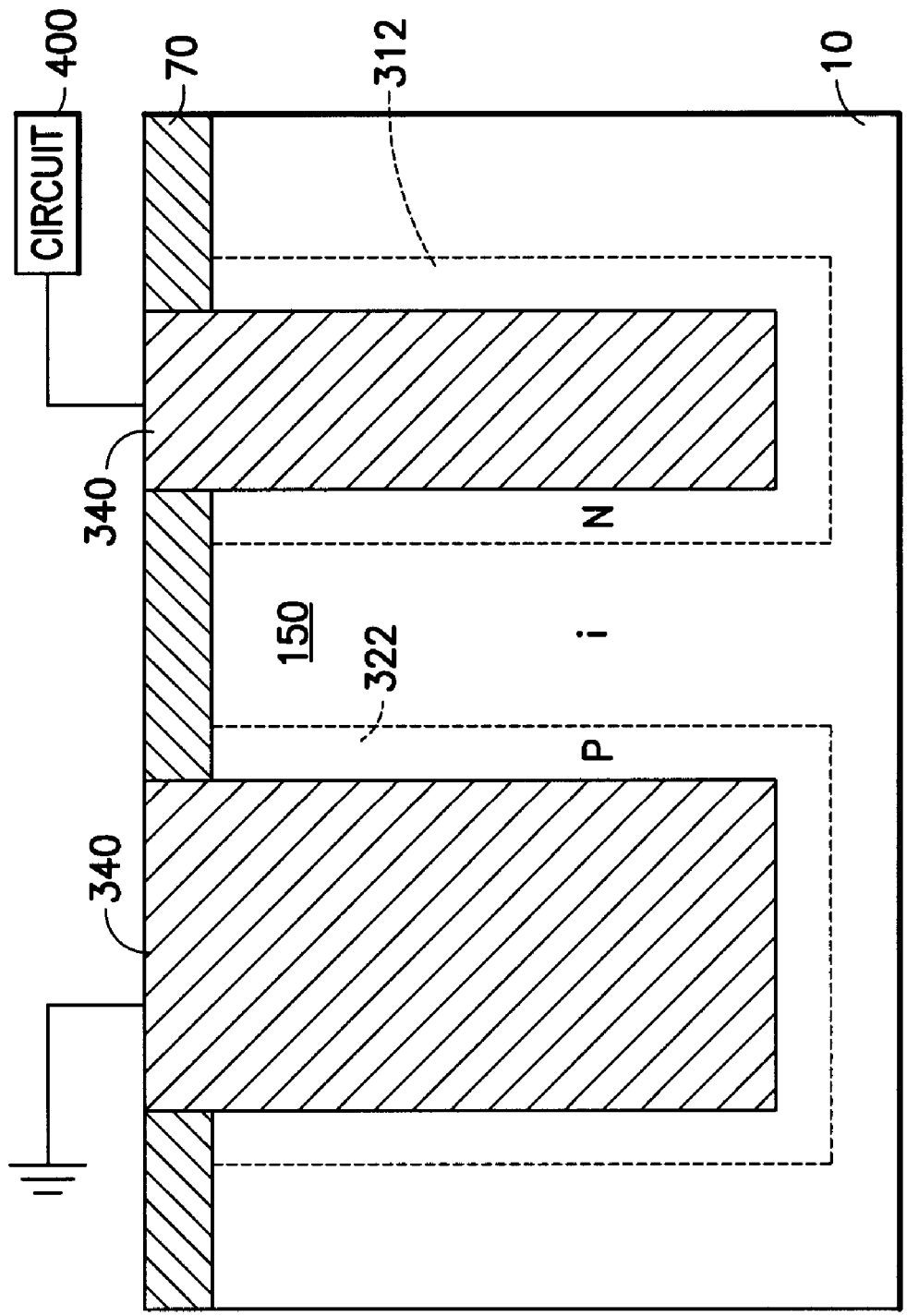

FIG. 13 shows the result of filling both trenches 230 and 235 with a metal or metal silicide 340 (e.g. W, Ti, Ta, TiN, WN, TaN, WSi, TiSi, CoSi, NiSi, etc) or any of their combinations by sputtering, plating, PVD, CVD, or any convenient method. It is not necessary to fill the trenches completely, and a central remaining aperture in one or both trenches would not be a problem.

The photodetector is now electrically complete and may be connected to ground on the left and to the remainder of the circuit that uses the photodetector, denoted schematically by box 400. Alternatively, if the photodetectors are intended to be discrete devices, the wafer can be diced and the photodetectors placed in systems of various kinds.

Figure 14:
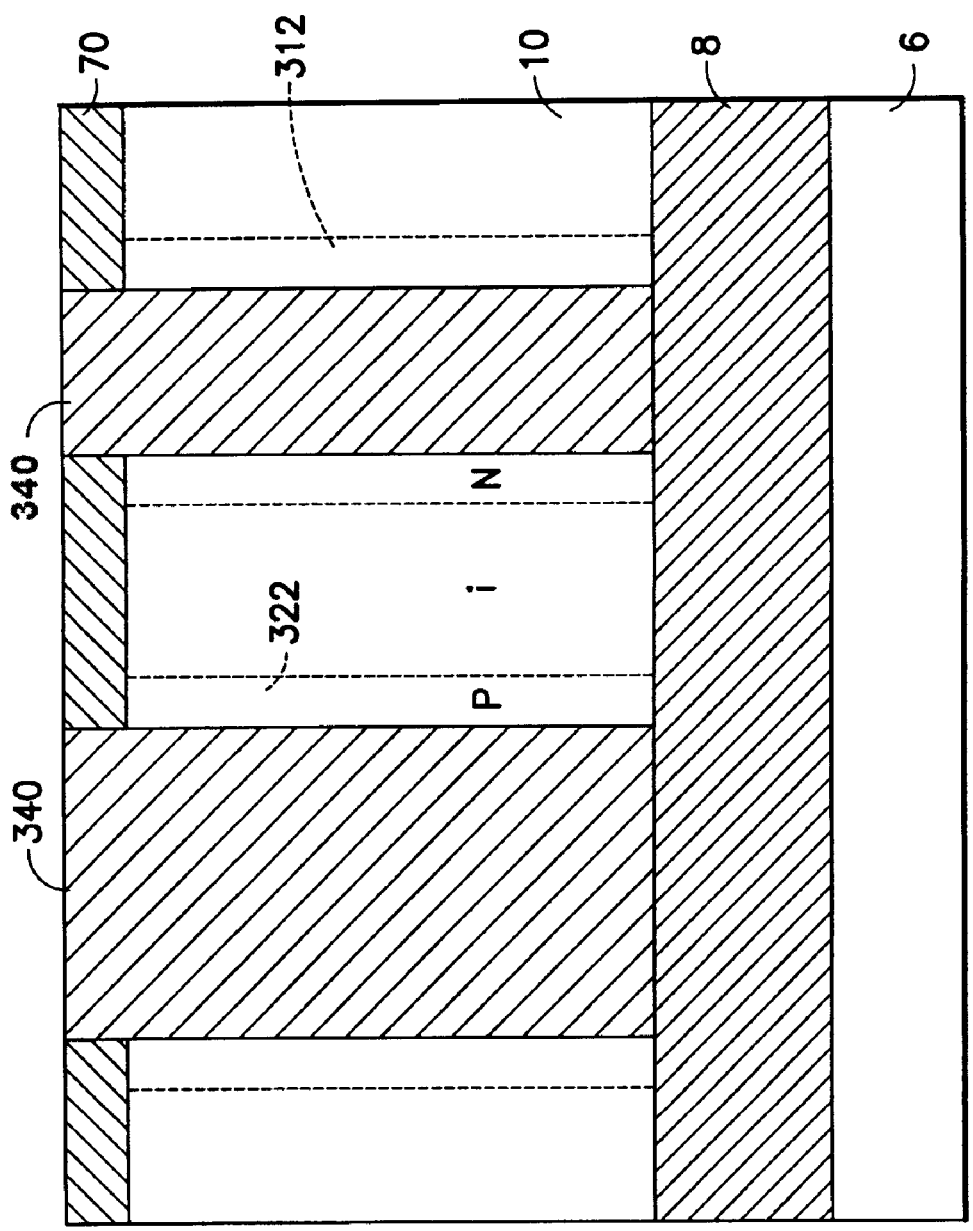
FIG. 14 shows a cross section of a version of the invention using an SOI wafer.

FIG. 14 illustrates an alternative version of the invention, in which the wafer containing the photodetectors is an SOI wafer having a bulk substrate 6 and a buried oxide 8. The presence of buried oxide BOX 8 will reduce capacitance and leakage, both thereby improving the performance of the devices.

Figure 15:
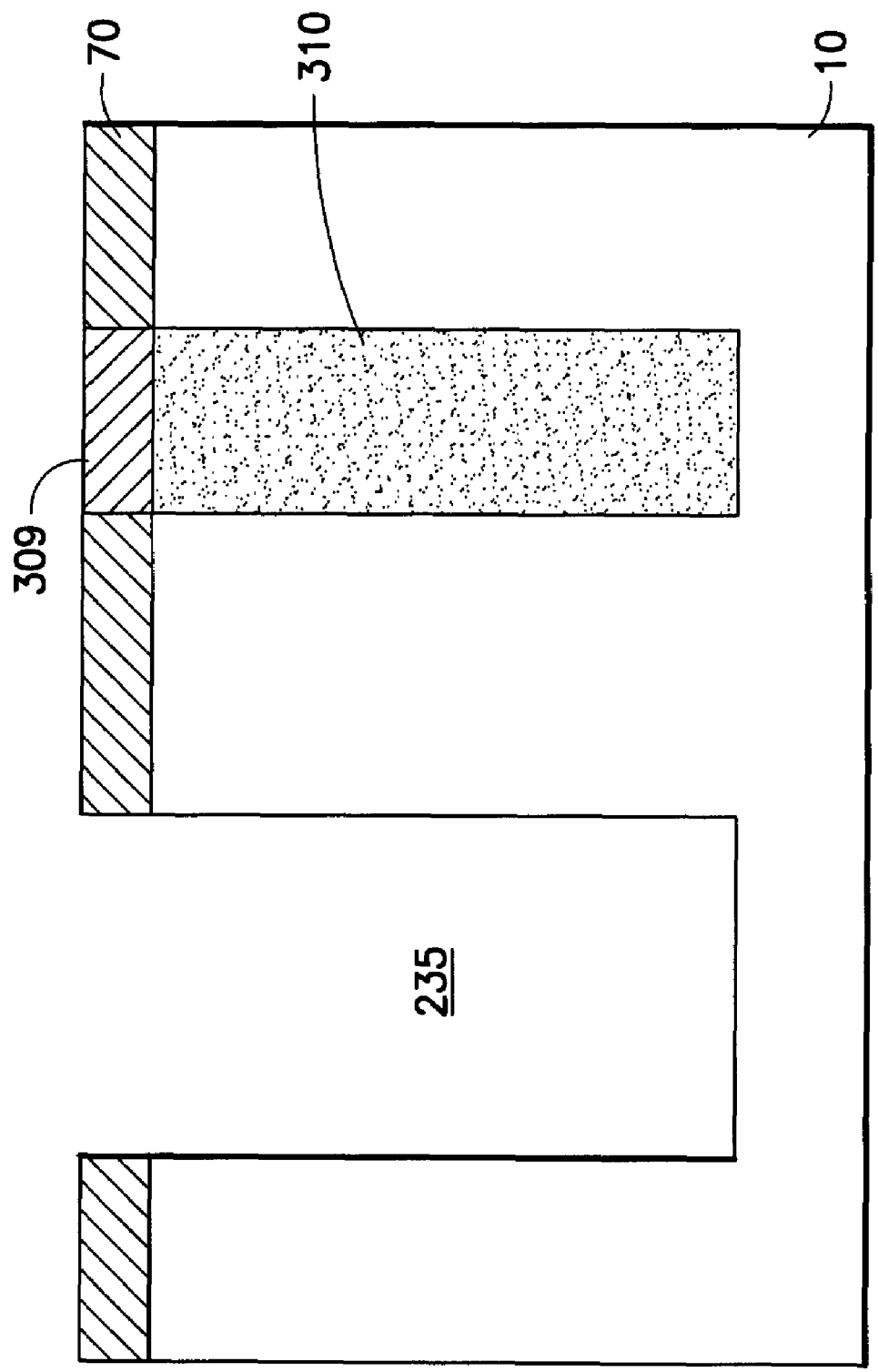
FIGS. 15 and 16 show steps in an alternative method of making the invention.
Figure 16:
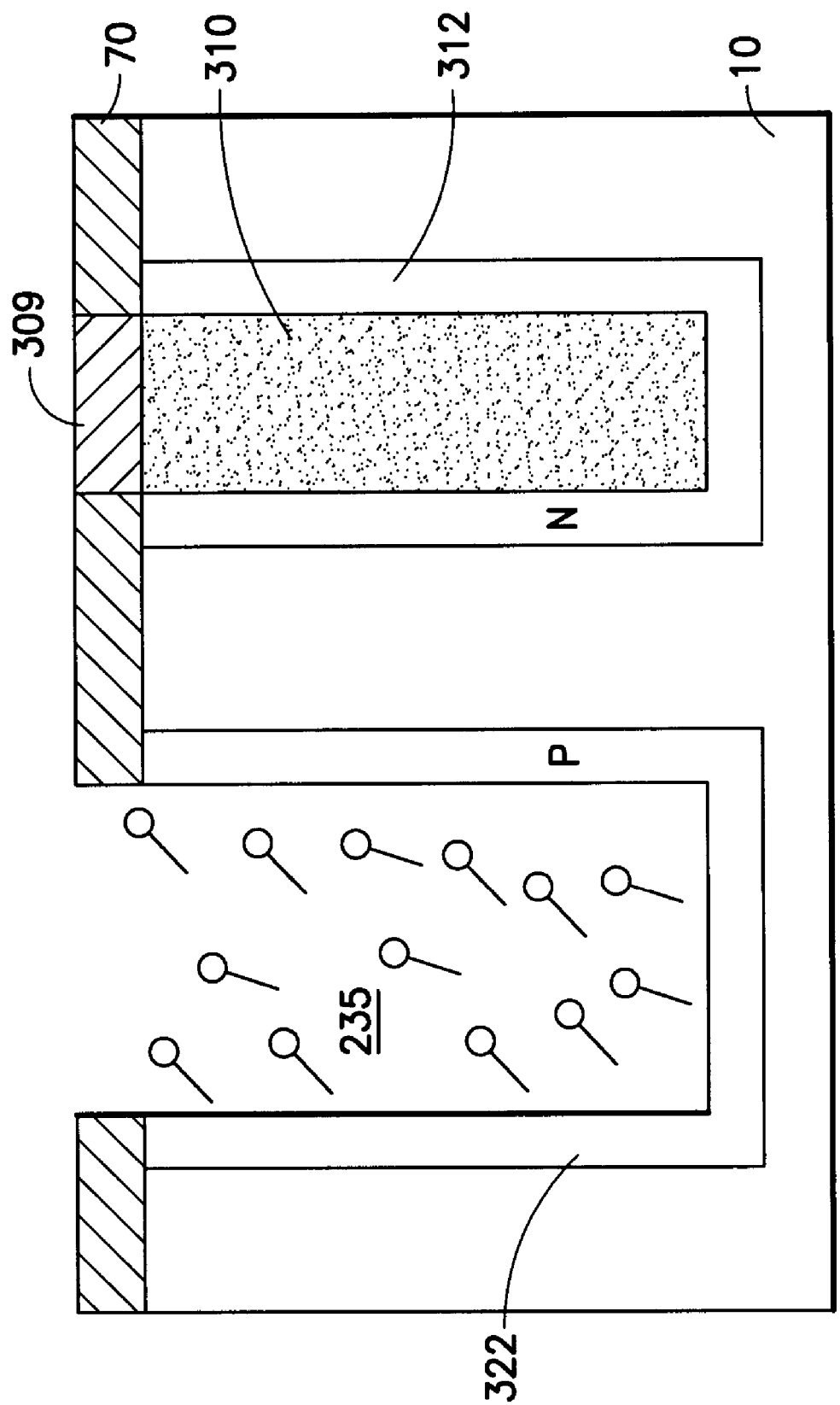

FIGS. 15 and 16 show steps in an alternative method of forming the p-i-n photodetector. FIG. 15 follows FIG. 9, when the wide trench has been opened by isotropic etching of the partially filled trench. On the right of FIG. 15, the narrow trenches have optionally been recessed and had a cap 309, such as undoped oxide, deposited. The function of the cap is to prevent the dopant in the narrow trenches from escaping into the ambient and depositing in an unwanted location somewhere on the wafer being processed. On the left, wide trench 235 is ready to be doped.

FIG. 16 shows the process of doping the wide trenches from the ambient. In this case, the method used is (P-type) gas phase doping, denoted by the small circles within trench 235. The dopant gas penetrates into substrate 10, forming P-type area 322.

Other methods of doping into an open trench (collectively referred to as doping from the ambient) include but are not limited to: plasma doping, ion implantation, liquid phase doping, infusion doping and plasma immersion ion implantation.

If the doping step is performed at a high temperature, the dopants in ASG 310 will be driven into substrate 10 at the same time. If the doping step is performed at a lower temperature, a thermal anneal can be used to activate the newly applied dopants and simultaneously drive the dopants in ASG 310 into the substrate.

After the step illustrated in FIG. 16, the cap 309 and ASG 310 are removed and the processing resumes as shown in FIGS. 12 and 13. The step shown in FIG. 13 may also be performed.

Those skilled in the art will appreciate that various modifications may be made in the example illustrated here. For example, the sacrificial material 310 and 320 carrying the dopants may be polycrystalline silicon or other material that can be deposited conformally and have a reasonable diffusion rate for both polarity of dopant. The two materials also need not be the same, e.g. oxide and polysilicon.

The preferred process of forming photodetector according to the invention may be summarized as:

Simultaneously form two sets of deep trenches, one set of trenches being wider than the other set such that the wider set has a remaining central aperture when the narrower set is conformally filled;

Completely fill the narrow trench and partially conformally fill the wide trench with a first sacrificial material doped with a first type of dopant;

Remove the first sacrificial material from the wide trench;

Deposit a second sacrificial material doped with a second (opposite) type of dopant in the wide trench;

Planarization (optional);

Form a cap layer (optional);

Thermal anneal to drive dopants into the substrate to form the p and n regions;

Remove the cap layer, first sacrificial material and second sacrificial material;

At least partially fill both trenches with the same conductor; and

Planarization (optional) to complete PIN diode formation.

The alternative preferred process of forming photodetector according to the invention may be summarized as:

Simultaneously form two sets of deep trenches, one set of trenches being wider than the other set such that the wider set has a remaining central aperture when the narrower set is filled;

Completely fill the narrow trench and partially fill the wide trench with a first sacrificial material doped with a first type of dopant;

Remove the first sacrificial material from the wide trench;

Form an (optional) cap atop the first material in the narrow trench;

Dope the wide trench from the ambient with a second type of dopant and dope the narrow trench with the first type of dopant;

Remove the cap layer and first sacrificial material;

At least partially fill both trenches with the same conductor; and

Planarization (optional) to complete PIN diode formation.

If the step of doping the wide trench is performed at a high temperature, the step of doping the narrow trenches takes place at the same time. If the step of doping the wide trenches takes place at a lower temperature, then the step of doping the wide and narrow trenches will use an anneal.

It is not necessary to completely fill the trenches with a conductive material. Depositing a conformal layer of conductive material that has a central aperture but makes contact over the full height of the trench is satisfactory.

Forming an ohmic connection is beneficial. It can be done preferably by filling both trenches with a metal or a metal silicide as shown. This has the advantage that only a single fill is required for both trenches. It does not matter if the narrow trenches are P or N-type. Furthermore, metals and metal suicides have lower resistance than polysilicon, so the response of the device is improved relative to prior art devices in which trenches are filled with n-type and p-type polysilicon.

While the invention has been described in terms of two preferred embodiment, those skilled in the art will recognize that the invention can be practiced in various versions within the spirit and scope of the following claims.

What is claimed is:

1. A method of forming a PIN photodetector having a set of p and n regions separated by a set of photon detector regions in a solid state wafer comprising the steps of:

Simultaneously forming two sets of deep trenches, separated by a set of photon detection regions, in said solid state wafer, one wide set of trenches being wider than the other narrow set, such that the wide set has a remaining central aperture when the narrower set is filled with a conformally deposited material;

Filling the narrow trenches and conformally partially filling the wide trenches with a first material doped with a first type of dopant;

Removing the first material from the wide trenches;

Depositing a second material doped with a second type of dopant of opposite polarity from said first type of dopant in the wide trenches;

Annealing the wafer to drive the first and second types of dopants into the substrate to form the p and n regions of the PIN photodetector;

Removing the first and second materials from both the wide and narrow trenches; and Filling both the wide and narrow trenches with a conductive material to form conductive electrodes connected to said p and n regions in both the wide and narrow trenches.

2. A method according to claim 1, in which the first and second materials are both silicon oxide.

3. A method according to claim 2, in which the conductive electrodes are formed from at least one metal or metal silicide.

4. A method according to claim 3, in which the conductive electrodes are formed from at least one metal or metal silicide selected from the group consisting of: W, Ti, Ta, TiN, WN, TaN, WSi, TiSi, CoSi, NiSi.

5. A method according to claim 1, in which the step of filling the narrow trenches and partially filling the wide trenches with a first material doped with a first type of dopant is performed by depositing a conformal layer of said first material, such that the narrow trenches are filled and the wide trenches have a layer of the first material on the sides thereof and a remaining central aperture.

6. A method according to claim 5, in which the first material is deposited in a layer having a thickness greater than one half the width of the narrow trenches and less than one half the width of the wide trenches, thereby filling the narrow trenches and producing the remaining central aperture in the wide trenches.

7. A method according to claim 1, in which the first material is removed in an isotropic etch.

8. A method according to claim 1, further comprising a step of depositing a cap layer over said two sets of deep trenches before said step of annealing.

9. A method of forming a PIN photodetector having a set of p and n regions separated by a set of photon detector regions in a solid state wafer comprising the steps of:

Simultaneously forming two sets of trenches, separated by a set of photon detection regions, in said solid state wafer, one wide set of trenches being wider than the other narrow set, such that the wide set has a remaining central aperture when the narrower set is filled with a conformally deposited material;

Filling the narrow trenches and conformally partially filling the wide trenches with a first material doped with a first type of dopant;

Removing the first material from the wide trenches;

Doping the wide trenches with a second type of dopant of opposite polarity by a doping method selected from the group consisting of gas phase doping, plasma doping, ion implantation, liquid phase doping, infusion doping, and plasma immersion ion implantation;

Annealing the wafer to drive the first and second types of dopants into the substrate to form the p and n regions of the PIN photodetector;

Removing the first material from the narrow trenches; and

Forming conductive material connected to said p and n regions in both the wide and narrow trenches.

10. A method according to claim 9, in which said step of doping the wide trenches and annealing the wafer to drive the first and second types of dopants into the substrate are performed simultaneously.

11. A method according to claim 9, in which the first material is doped silicon oxide.

12. A method according to claim 9, in which the conductive material includes at least one metal or metal silicide.

* * * * *